(12) United States Patent
Kunin et al.

(10) Patent No.: US 9,722,510 B2
(45) Date of Patent: Aug. 1, 2017

(54) MODULAR INVERTER PLATFORM PROVIDING PHYSICAL AND ELECTRICAL CONFIGURABILITY AND SCALABILITY

(71) Applicant: Cummins Power Generation IP, Inc., Minneapolis, MN (US)

(72) Inventors: Sergey Kunin, Minnetonka, MN (US); Bradford K. Palmer, Ham Lake, MN (US); Elias M. Ayana, Blaine, MN (US)

(73) Assignee: Cummins Power Generation IP, Inc., Minneapolis, MN (US)

( * ) Notice: Subject to any disclaimer, the term of this patent is extended or adjusted under 35 U.S.C. 154(b) by 63 days.

(21) Appl. No.: 14/728,556

(22) Filed: Jun. 2, 2015

(65) Prior Publication Data

US 2015/0349661 A1 Dec. 3, 2015

Related U.S. Application Data

(60) Provisional application No. 62/007,205, filed on Jun. 3, 2014.

(51) Int. Cl.
*H02M 7/5387* (2007.01)
*H05K 1/14* (2006.01)
(Continued)

(52) U.S. Cl.
CPC ......... *H02M 7/5387* (2013.01); *H05K 1/141* (2013.01); *H05K 1/148* (2013.01); *H05K 3/368* (2013.01); *H05K 7/1432* (2013.01)

(58) Field of Classification Search
CPC ... H02M 7/5387; H05K 7/1432; H05K 3/368; H05K 1/148; H05K 1/141
(Continued)

(56) References Cited

U.S. PATENT DOCUMENTS 3,746,963 A * 7/1973 VeNard, II ............. H02M 5/45
363/137
4,134,631 A * 1/1979 Conrad ................ H05K 7/1448
361/802
(Continued)

FOREIGN PATENT DOCUMENTS

EP 0 743 744 11/1996
JP 2000-261139 9/2000

OTHER PUBLICATIONS

Search report from EIC 2800 STIC searcher John Digeronimo on Jul. 28, 2016.*
(Continued)

*Primary Examiner* — Jue Zhang
*Assistant Examiner* — Htet Z Kyaw
(74) *Attorney, Agent, or Firm* — Foley & Lardner LLP

(57) ABSTRACT

Modular inverter platforms and methods for providing physical and electrical configurability and scalability are disclosed. The modular inverter apparatus includes a printed circuit board (PCB) comprising at least two modules and one or more mounting components structured to switch the at least two modules between a plurality of physical configurations. The modular inverter apparatus also includes a plurality of electrical interconnections structured to electrically connect the at least two modules and to switch the at least two modules between a plurality of electrical configurations.

27 Claims, 12 Drawing Sheets

(51) Int. Cl.
*H05K 3/36* (2006.01)
*H05K 7/14* (2006.01)

(58) Field of Classification Search
USPC .................. 363/132, 147, 141, 144, 146
See application file for complete search history.

(56) References Cited

U.S. PATENT DOCUMENTS

| | | | | |
|---|---|---|---|---|
| 5,800,186 | A * | 9/1998 | Ramirez | H01R 12/721 |
| | | | | 439/74 |
| 6,328,598 | B1 | 12/2001 | Harris, Jr. | |
| 6,909,607 | B2 * | 6/2005 | Radosevich | H02M 1/44 |
| | | | | 165/80.4 |
| 6,950,321 | B2 | 9/2005 | Stancu et al. | |
| 7,164,590 | B2 * | 1/2007 | Li | H02M 7/5387 |
| | | | | 363/40 |
| 7,554,214 | B2 * | 6/2009 | Fattal | B60L 11/123 |
| | | | | 290/40 C |
| 7,952,225 | B2 * | 5/2011 | Reichard | B60L 13/04 |
| | | | | 307/10.1 |
| 7,982,331 | B2 * | 7/2011 | Murray | H05K 7/1432 |
| | | | | 165/185 |
| 8,217,534 | B2 | 7/2012 | Sok et al. | |
| 8,878,468 | B2 * | 11/2014 | Dooley | H02H 7/08 |
| | | | | 318/278 |
| 9,210,834 | B2 * | 12/2015 | Nakatsu | H02M 7/003 |
| 2001/0008483 | A1 | 7/2001 | Lee et al. | |
| 2002/0078560 | A1 * | 6/2002 | Reijnders | H05K 1/148 |
| | | | | 29/846 |
| 2006/0120001 | A1 * | 6/2006 | Weber | H02M 7/003 |
| | | | | 361/103 |
| 2011/0116294 | A1 | 5/2011 | Wolf | |
| 2012/0139483 | A1 * | 6/2012 | Cottet | H01G 2/06 |
| | | | | 320/107 |
| 2012/0163057 | A1 * | 6/2012 | Permuy | H02M 7/487 |
| | | | | 363/131 |
| 2012/0313564 | A1 * | 12/2012 | Guitard | H02M 7/48 |
| | | | | 318/400.21 |
| 2014/0119086 | A1 * | 5/2014 | Potharaju | H02M 7/5387 |
| | | | | 363/132 |
| 2015/0340966 | A1 * | 11/2015 | Mutsuura | H02M 7/5387 |
| | | | | 363/98 |
| 2016/0322825 | A1 * | 11/2016 | Urry | H02J 1/102 |

OTHER PUBLICATIONS

The International Search Report and Written Opinion of the International Searching Authority issued in PCT/US2015/033763, dated Sep. 17, 2015.

* cited by examiner

MODULAR INVERTER PLATFORM PROVIDING PHYSICAL AND ELECTRICAL CONFIGURABILITY AND SCALABILITY

CROSS REFERENCE TO RELATED APPLICATIONS

This application claims the benefit of U.S. Provisional Patent Application No. 62/007,205 entitled, "MODULAR INVERTER PLATFORM PROVIDING PHYSICAL AND ELECTRICAL CONFIGURABILITY AND SCALABILITY," filed Jun. 3, 2014, which is incorporated herein by reference in its entirety.

TECHNICAL FIELD

The present application relates to inverters. More particularly, the present application relates to modular inverter platform providing multiple physical and electrical configurations.

BACKGROUND

Inverters utilize power electronics to supply precise AC electrical output to multiple applications and loads. Variable speed genset systems also typically utilize power electronics to use a variable speed source of mechanical power such as an internal combustion engine configured to mechanically drive a generator to provide variable AC electrical output. Because the overall system output must frequently be precisely controlled to match the needs of a given load, power electronics are utilized to convert the variable AC electrical output from the generator to provide a controlled output matching the load requirements. The power electronics may utilize a rectifier to convert the variable AC electrical output from the generator in a variable speed genset to DC, and a DC link to couple the rectifier to an inverter which provides controlled AC electrical output matching the requirements of the load. It is noted that in inverter-only systems, a direct DC input is often utilized, typically from a battery or other DC source, such as photovoltaics. In existing systems, these and other power electronics components have been designed and selected to meet the particular power, performance and packaging needs of a given application. These needs may vary significantly between different applications. There remains a significant need for the modular inverter platforms disclosed herein and the physical and electrical configurability and scalability provided by these platforms.

SUMMARY

One embodiment relates to a modular inverter apparatus that includes a printed circuit board (PCB). The PCB includes at least two modules and one or more mounting components structured to switch the at least two modules between a plurality of physical configurations. In a first physical configuration, the one or more mounting components couple a second module of the at least two modules to a first module of the at least two modules in a first position. In a second physical configuration, the one or more mounting components couple the second module to the first module in a second position different from the first position. The PCB also includes a plurality of electrical interconnections structured to electrically connect the at least two modules and to switch the at least two modules between a plurality of electrical configurations. The plurality of electrical interconnections are structured to provide a connection between a first plurality of contacts of the first module to a second plurality of contacts of the second module in both the first physical configuration and the second physical configuration.

Another embodiment relates to a method for achieving physical and electrical configurability on a printed circuit board (PCB). The method includes dividing a printed circuit board (PCB) of an inverter into at least two modules. The PCB comprises one or more mounting components structured to switch the at least two modules between a plurality of physical configurations. In a first physical configuration, the one or more mounting components couple a second module of the at least two modules to a first module of the at least two modules in a first position. In a second physical configuration, the one or more mounting components couple the second module to the first module in a second position different from the first position. The method also includes electrically connecting the at least two modules in a plurality of electrical configurations via a plurality of electrical interconnections. The at least two modules each comprise at least one of a rectifier module, an inverter bridge module, a filter module, an inverter bridge driver module, an inverter controller module, a current sensor module, a voltage sensor module, and a thermal management module. The plurality of electrical interconnections are structured to provide a connection between a first plurality of contacts of the first module to a second plurality of contacts of the second module in both the first physical configuration and the second physical configuration.

Yet another embodiment relates to a modular inverter apparatus that includes a printed circuit board (PCB). The PCB includes at least two modules and one or more mounting components structured to switch the at least two modules between a plurality of physical configurations. In a first physical configuration, the one or more mounting components couple a second module of the at least two modules to a first module of the at least two modules in a first position. In a second physical configuration, the one or more mounting components couple the second module to the first module in a second position different from the first position. The PCB also includes one or more jumpers structured to electrically connect the at least two modules in a plurality of electrical configurations. The one or more jumpers are structured to provide a connection between a first plurality of contacts of the first module to a second plurality of contacts of the second module in both the first physical configuration and the second physical configuration.

These and other features, together with the organization and manner of operation thereof, will become apparent from the following detailed description when taken in conjunction with the accompanying drawings.

DETAILED DESCRIPTION

Referring to the Figures generally, the various embodiments disclosed herein relate to modular inverter platform providing multiple configurations and methods for achieving physical and electrical configurability of the modular inverter apparatus. Inverters utilize power electronics to supply precise AC output to multiple applications and loads. In different systems, different power electronics components are designed and selected to meet the power, performance, and packaging needs of different applications, which may vary significantly. The modular inverter platforms disclosed herein provide multiple physical and electrical configurations for different applications. Unique modular inverter platforms providing physical and electrical configurability and scalability are disclosed. An exemplary platform may be used to implement a variety of different systems that utilize the same 3 leg/6 transistor inverter module, and allow the same module to be used for either single phase output, split phase output/2-phase, or 3-phase output implementations. This allows a single inverter output stage design to be produced and configured for use in multiple applications, physical configurations, and kW ranges. This configuration can occur by either software, jumper, or the addition/subtraction of optional circuit elements (e.g., inductors, capacitors, and/or transformers) to provisioned connection locations on the output filtering stage or combinations thereof. The configuration may be performed during production using different bills of materials (BOMs) specifying different jumper/trace connection and different output filter component selection), during installation in the field using different hardware jumper configurations, or as a reconfiguration after field installation. Software reconfiguration or operating mode selection may also be utilized to provide the appropriate control signals corresponding to a given output. Inverter output filter configuration can be modified by output filter element addition/subtraction/jumpering of inductors, capacitors, and/or transformers at pre-provisioned connection locations on the output filtering stage. The inverter output filter stage can be either integral or a separate board/component. If separate, configuration can be accomplished by simple swapping of the output filter stage.

Figure 1:
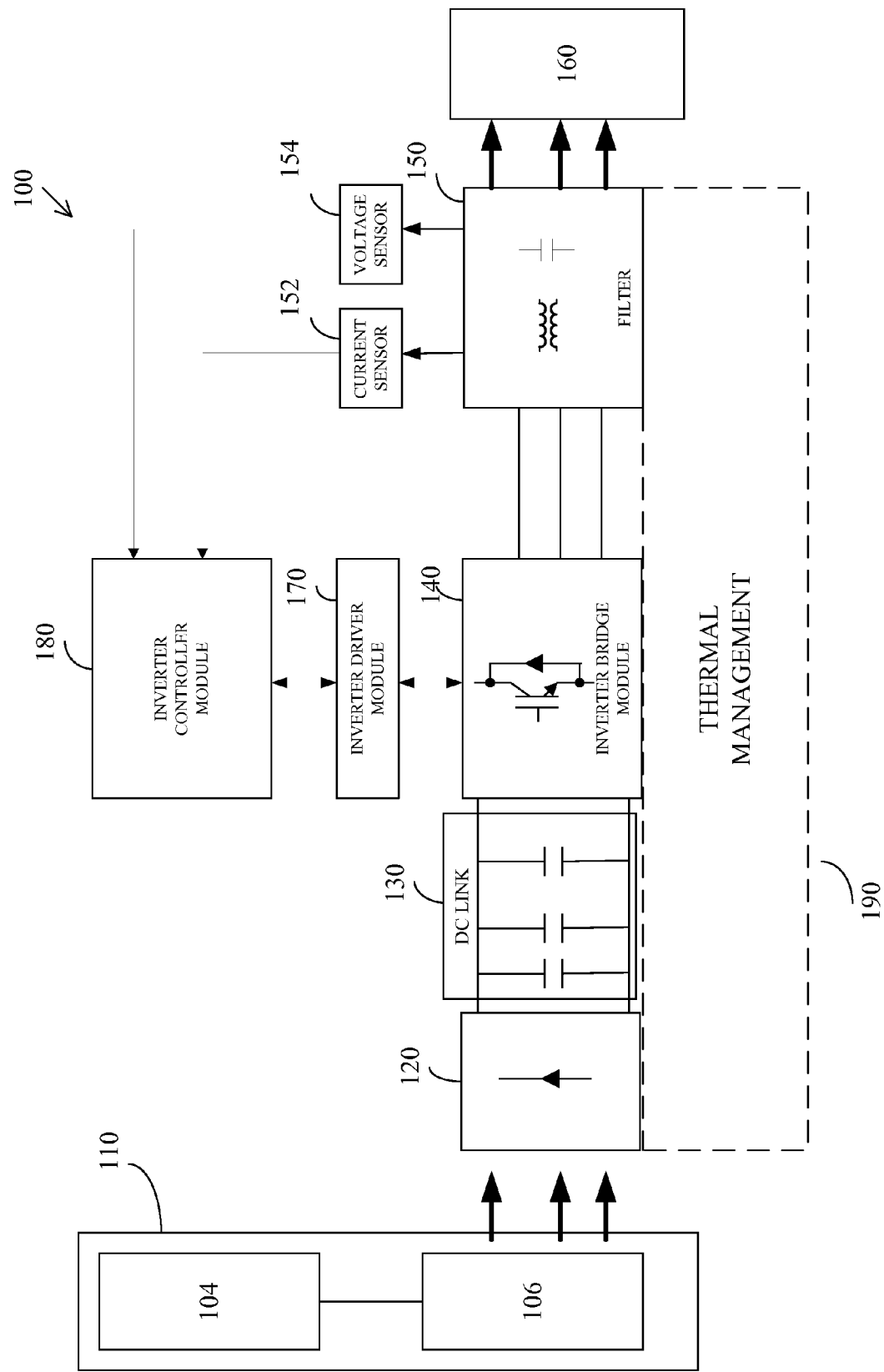
FIG. 1 is a block diagram of an exemplary modular inverter platform.

With reference to FIG. 1 there is illustrated a block diagram of an exemplary modular inverter platform 100 which may be implemented as a number of different inverter systems having varying physical and electrical components and characteristics. Platform 100 is configured to receive 3-phase AC power output from a variable speed engine 104 coupled to an alternator. The variable speed engine and the alternator are part of a variable speed genset 110. The variable speed engine 104 is configured to drive the generator 106. The 3-phase output of the variable speed engine 104 is provided to rectifier module 120 which converts the AC input to a DC output which is provided to DC link module 130. DC link module 130 is operatively coupled with inverter bridge module 140. Inverter bridge module 140 is configured to convert DC power from DC link module 130 to an AC output which is provided to filter module 150. The output of filter module 150 is provided to drive a load 160, which may be, for example, a utility line, a residential or commercial power supply system, or another type of load. It is also contemplated that filter module 150 may be omitted and platform 100 may be configured to provide direct output. In one embodiment, this can be utilized to drive an electric motor, for example, in a hybrid vehicle powertrain or industrial motor. In other embodiments, direct inverter stage output can be utilized for battery chargers, power converters, or for paralleling with other inverters to a common large capacity output stage. In addition, the rectifier stage can be omitted and the inverter directly connected to a high voltage DC bus or source (for example by not populating the rectifier and replacing it with jumpers on the board, or by providing a direct coupling to the DC link module 130 or inverter bridge module 140).

Inverter bridge module 140 is configured to be controlled by inverter controller module 180 which outputs a control signal to driver module 170 which in turn outputs drive signals to the inverter module 140. In certain embodiments inverter bridge module is configured as a three leg/six transistor IGBT or FET bridge. In certain embodiments the inverter bridge is a multi-level inverter bridge that incorporates multiple transistors and intermediate voltage levels in each leg of the bridge, allowing low harmonic fine voltage control of the output or higher voltage utilization on input/output. It is also noted that in various embodiments the inverter design is compatible with multiple bridge designs and bridge transistor device types, such as wide band-gap devices (such as Silicon Carbide or Gallium Nitride), or with the above multi-level bridges, without changing controller and output stage.

Current sensor module 152 and voltage sensor module 154 are configured to provide information of current and voltage at the filter module 150 to inverter controller 180. Thermal management module 190 is configured to transfer heat away from at least one of rectifier module 120, inverter bridge module 140, and filter module 150.

The modules illustrated in FIG. 1 are configurable and scalable to implement multiple different inverter systems which may include different inverter electrical output configurations, different inverter physical and packaging configurations, and/or different component population configurations. The configuration and scaling may include selection of different components from families of compatible modules, reprogramming or reconfiguration of software implemented in inverter control module 180, selection of different components and component configurations providing electrical interconnection among the modules, or combinations thereof. A number of modules may be common to multiple different inverter systems, allowing plug-and-play "parts bin" design and component reuse. It is further noted that diagnosis and repair is also enabled by the modular approach so that repairs can be quickly done by service technicians by replacing only the failed element, board segment, or stage. Commonality of design and control systems also minimize infant-care and speed maturity for newly designed product, avoiding the problematic issues with "one-off" hand tweaked inverter designs and control software. Common inverter/genset output stages can also allow for software/field programmable local grid code compliance, recall issues, issue fixes, or output filter stage swapping/element changing.

In certain forms inverter control module 180 and inverter driver module 170 may be the same across multiple different inverter systems. Rectifier module 120, DC link module 130, inverter bridge module 140, current sensor module 152, and voltage sensor module 154 may interchangeably utilize a plurality of electrical components, electrical interconnections, and physical configurations. Filter module 150 may be configured to interchangeably utilize a plurality of output filter components. Similarly thermal management module 190 may be configured to interchangeably utilize a plurality of different types of thermal management devices such as heat sinks, liquid coolers, and active cooling devices. This configurability and scalability allows the same inverter platform to be utilized for multiple different output power and output voltage configurations including single phase outputs, split phase outputs, and three phase outputs. One exemplary inverter platform disclosed herein is configurable to any of the configurations listed in Table 1 below. It shall be appreciated, however, that these configurations are exemplary and not limiting and that a variety of other power nodes and voltage configurations may also be utilized.

TABLE 1

Output power/output voltage configurations achieved by the inverter platform

| Output Power | Output Voltage |
| --- | --- |
| 3 kilowatts (kW) | single phase 120 V, 50/60 Hz |
| 4 kW | single phase 120 V, 50/60 Hz |
| 6 kW | split phase 120/120/240 V, 50/60 Hz |
| 8 kW | split phase 120/120/240 V, 50/60 Hz |
| 16 kW | split phase 120/120/240 V, 50/60 Hz |
| 6 kW | single phase 230 V, 50/60 Hz |
| 8 kW | single phase 230 V, 50/60 Hz |
| 16 kW | single phase 230 V, 50/60 Hz |
| 3 kW-16 kW | three phase 480 V, 50/60 Hz |
| 3 kW-16 kW | three phase 208 V, 50/60 Hz |

Figure 2:
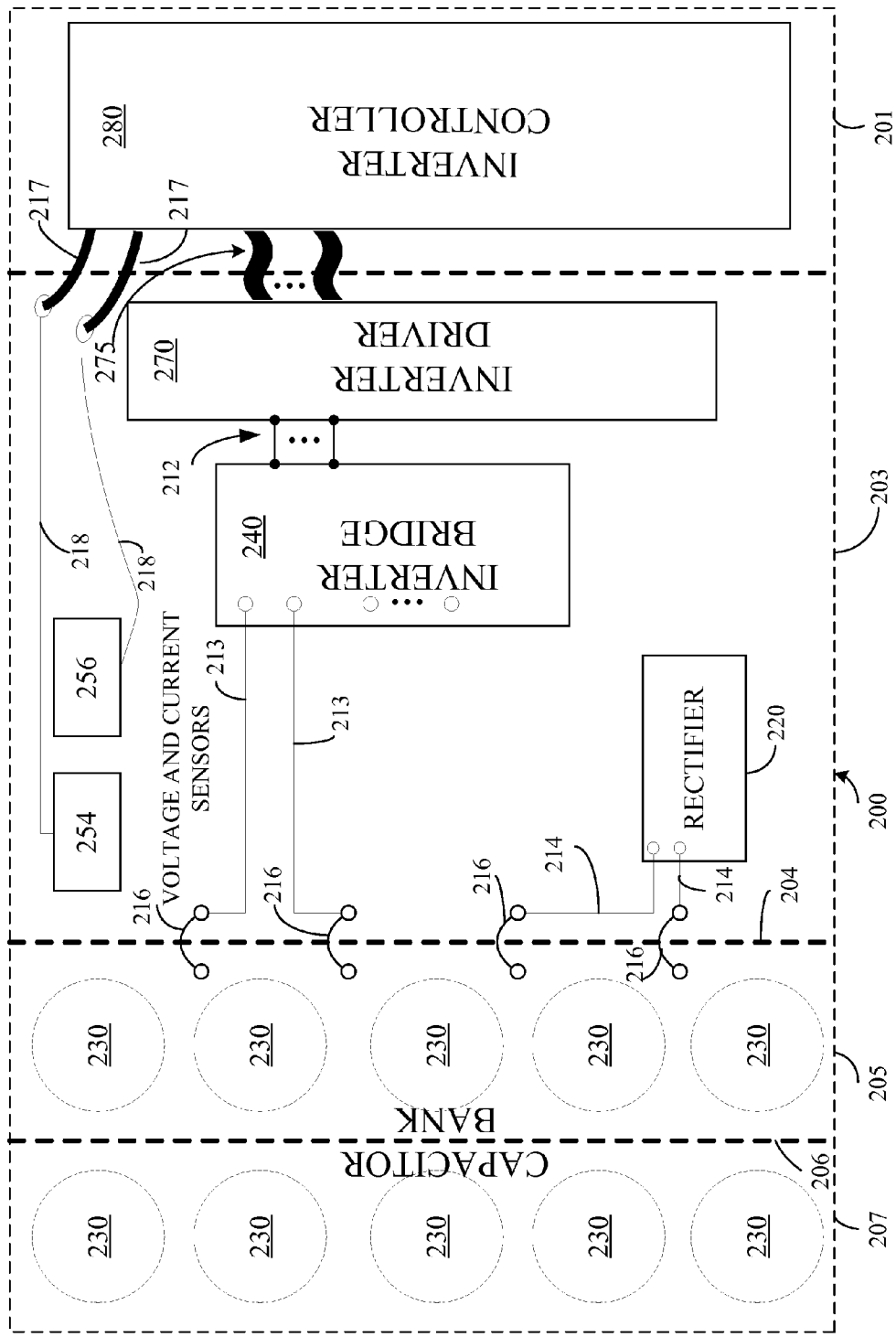
FIG. 2 is a top view of an exemplary printed circuit board.

With reference to FIG. 2 there is illustrated an exemplary modular printed circuit board ("PCB") 200. PCB 200 includes board sections 201, 203, 205 and 207, and board division features 202, 204 and 206 which may comprise perforations, scoring, or other features configured to facilitate the separation of board sections 201, 203, 205 and 207 from one another to permit physical reconfiguration of PCB 200 while also providing sufficient structural integrity for PCB 200 to be maintained in the non-separated configuration illustrated in FIG. 2. PCB 200 includes a plurality of module footprints which define features for electrically coupling PCB 200 with a variety of devices and components which may be populated on PCB 200. A plurality of capacitor footprints 230 are provided on board sections 205 and 207. Rectifier footprint 220, inverter bridge footprint 240, inverter driver footprint 270, current sensor footprint 254, and voltage sensor footprint 256 are provided on board section 203. Inverter controller footprint 280 is provided on board section 201.

The electrical interconnection features utilized in connection with PCB 200 are configured to accommodate the physical reconfiguration of different board sections and provide interchangeability and compatibility of components. Electrical communication between an inverter controller populated in inverter control footprint 280 and inverter driver populated in inverter driver footprint 270 may be provided by one or more flexible conductive ribbons 275 without requiring a conductive trace physically coupled with PCB 200. It is also contemplated that one or more jumpers or wires may be utilized to electrically couple the inverter control module and the inverter driver module. Electrical communication between a current sensor module populated in current sensor footprint 254 and a voltage sensor module populated in voltage sensor footprint 256 may be provided by one or more conductive wires, jumpers or ribbons 217 in electrical communication with conductive traces 218 which are in electrical communication with a current sensor module populated in current sensor footprint 254 and a voltage sensor module populated in voltage sensor footprint 256 sensing the voltage and current at the filter 150 or from the IGBT bridge 140 output.

Electrical communication between a rectifier bridge populated in rectifier bridge footprint 220 and capacitors populated in capacitor footprints 230 may be provided by buss connectors 216 coupled with electrical contacts provided on board sections 203 and 205. The contacts on board section 203 are in electrical communication with conductive traces 214 of PCB 200 which are in electrical communication with a rectifier module populated in rectifier footprint 240. Buss connectors 216 may also be used to provide electrical communication between capacitors populated in capacitor banks 230 and conductive traces 213 of PCB 200 which are in electrical communication with an inverter bridge module populated in inverter footprint 240. Buss connectors 216 may be configured as one or more buss bars, conductive standoffs, jumpers, or wires or combinations thereof. In the illustrated embodiment electrical contacts are provided on both a top and bottom surfaces of board sections 203 and 205 to permit physical reconfiguration and/or stacking of the board sections.

Figure 3:
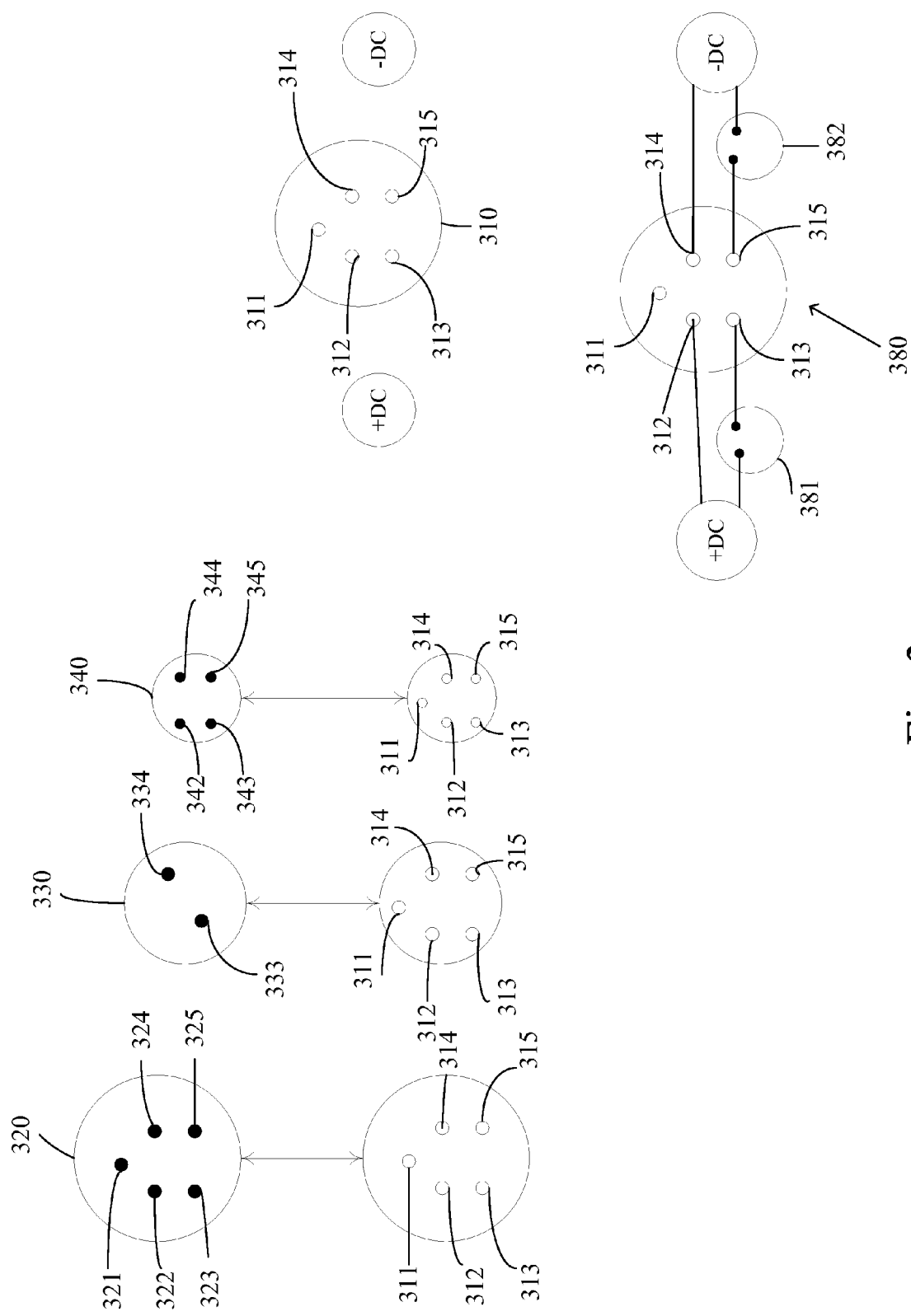
FIG. 3 is a top view of an exemplary printed circuit board component footprint, multiple exemplary components compatible with the footprint, and exemplary electrical connections for the footprint.

The module footprints of PCB 200 are preferably configured to accommodate coupling with defined families of devices or components having different interconnection features. This family compatibility facilitates electrical configurability and scalability of PCB 200. One example of this family compatibility is shown in FIG. 3 which illustrates the compatibility of a single capacitor footprint 310 with a plurality of capacitor devices 320, 330, and 340 having different capacitance values. It shall be appreciated that capacitor footprint 310 may be utilized as one or more of the capacitor footprints 230 described above in connection with FIG. 2 as well as other types of footprints. Furthermore, while the illustrated example is described in the context of capacitor devices and capacitor footprints, it shall be appreciated that similar family compatibility is contemplated for the other footprints of PCB 200 which may compatibly mate with multiple devices with different geometric and electrical interconnections. It is further noted that these differing capacitor footprints allow for placement of the capacitors on either side of the PCB 200, allowing for differing physical configurations and placements.

Capacitor footprint 310 is physically compatible with each of capacitor devices 320, 330 and 340. Footprint 310 includes an array of electrical contacts 311-315 which may be surface mount contacts, through hole contacts, or other types of contacts. Capacitor device 320 includes a corresponding array of electrical contacts 321-325 which are configured to mate with respective ones of contacts 311-315. Capacitor device 330 includes an array of electrical contacts 333 and 334 which comprise a subset of the electrical contacts 321-325 and are configured to mate with electrical contacts 313 and 314 respectively. Capacitor device 340 includes an array of electrical contacts 342-345 which comprise a subset of the electrical contacts 321-325 and are configured to mate with respective ones electrical contacts 312-313.

Capacitor footprint 310 is also electrically compatible with each of capacitor devices 320, 330 and 340. In the illustrated example, electrical contact 313 is electrically coupled with a positive DC bus rail and electrical contact 314 is electrically coupled with a negative DC bus rail. The corresponding contacts of each of devices 320, 330 and 340 are configured to be coupled with respective ones of these rails.

In certain forms the remaining contacts 311, 312, and 315 of footprint 310 may be cold contacts which provide physical support but no electrical interconnection. In certain other forms redundant electrical connections to the positive and negative DC bus rails may be provided. For example, as illustrated in electrical configuration 370, contacts 312 and 313 may be connected to the positive DC bus rail and contacts 314 and 315 may be connected to the negative DC bus rail. In certain further forms selectable or controllable redundant electrical connections to the positive and negative DC bus rails may be provided. For example, as illustrated in electrical configuration 380, contact 312 may have a dedicated connection to the positive DC bus rail and contact 313 may have a selectable connection to the positive DC bus rail. The selectable electrical connection may be provided by connector 381 which may be a controllable device such as a relay coupled with PCB 200. Connector 381 may also be a conductive feature such as a buss bar, wire or jumper which is selectably populated, or not populated on PCB 200 to control the electrical configuration of the PCB 200.

Figure 4:
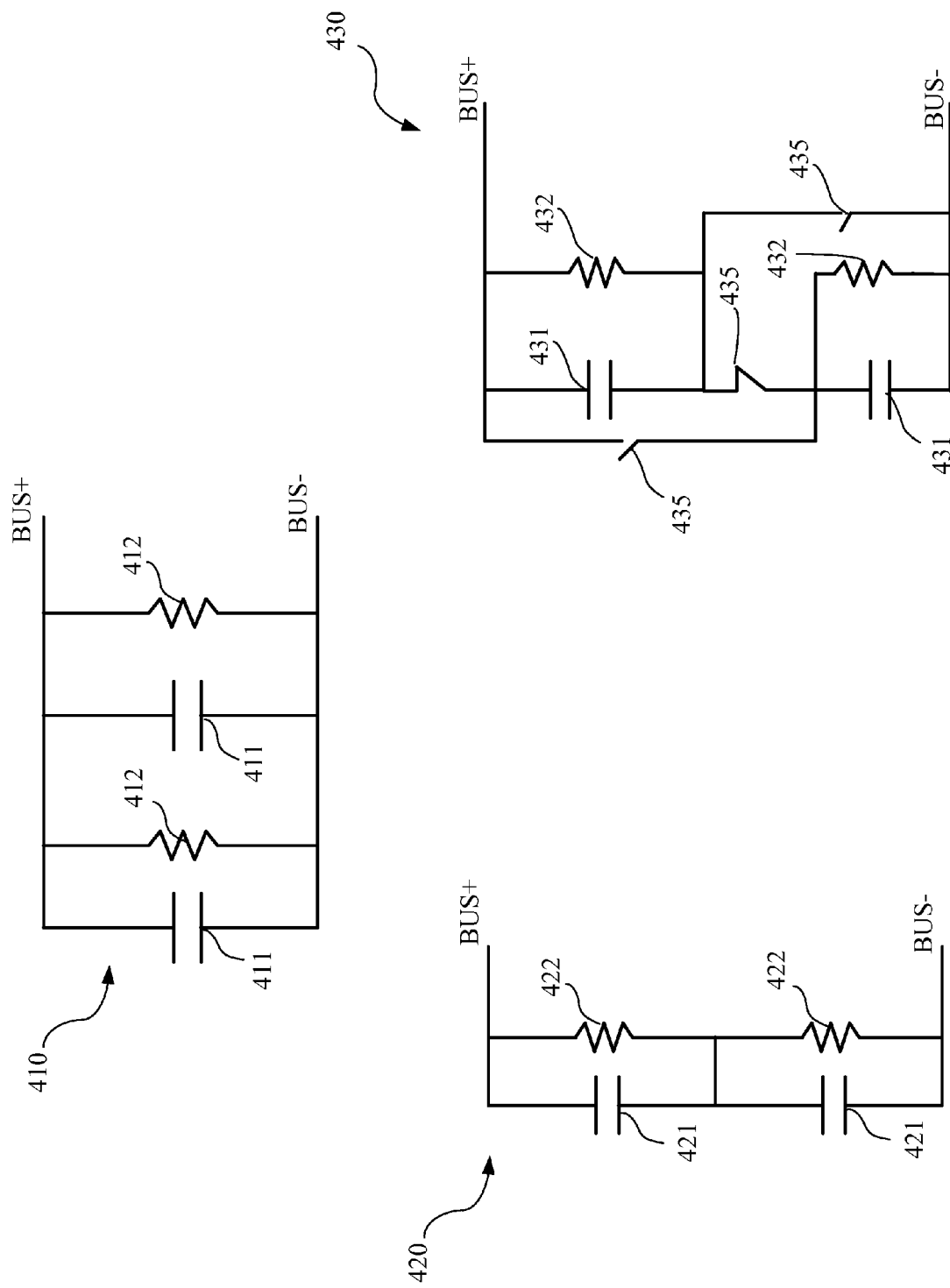
FIG. 4 is a circuit diagram of several exemplary DC link capacitor bank configurations.

The family compatibility of the module footprints of PCB 200 allows the same PCB to be used to implement multiple electrical configurations. FIG. 4 illustrates three exemplary DC bus electrical circuits 410, 420 and 430 for the DC link module 130 and capacitor banks 205, 207 which can be implemented by configuring PCB 200 with different electrical interconnections between its footprints and populating the footprints with different devices. Circuit 410 illustrates a parallel connection of bus capacitors and bleed resistors which may be utilized for low voltage/single phase output configuration. Circuit 410 is implemented by connecting a plurality of capacitor and resistor footprints in parallel across the positive and negative DC bus rails populating these footprints with capacitors 411 and bleed resistors 412. It shall be appreciated that the electrical connections to the footprints on PCB 200 may be made provided using existing conductive traces of PCB 200 and/or by adding electrical connectors, buss bars, conductive standoffs, jumpers, or wires to couple electrical contacts provided on PBC 200.

Circuit 420 illustrates a series connection of capacitors and bleed resistors which may be utilized for high voltage DC Bus applications. Circuit 420 is implemented by connecting a first set of footprints to the positive DC bus rail, connecting a second set of footprints to the negative DC bus rail, connecting groups of the first and second set of footprints in the illustrated parallel/series relationship and populating the footprints with capacitors 421 and resistors 422. It is noted that the bleed resistors 422 can also function as balance resistors, balancing voltage across the capacitors, when the capacitors are in a series configuration, such as in circuit 420.

Circuit 430 illustrates a reconfigurable connection of bus capacitors and bleed resistors which may be utilized for both low voltage DC Bus applications and high voltage DC Bus applications. Circuit 430 is implemented by connecting a first set of footprints to the positive DC bus rail, connecting a second set of footprints to the negative DC bus rail, connecting groups of the first and second set of footprints in the illustrated parallel/series relationship utilizing controllable switching devices 435, such as relays, electrical connectors, buss bars, conductive standoffs, jumpers, or wires, and populating the footprints with capacitors 431 and resistors 432. Thus, circuit 430 may provide configurable capacitor bank by incorporating one or more switches, jumpers, relays or other switching element to allow the capacitor bank to be coupled in either a high or low voltage configuration (by coupling in serial or parallel) with bleed resistors.

Figure 5:
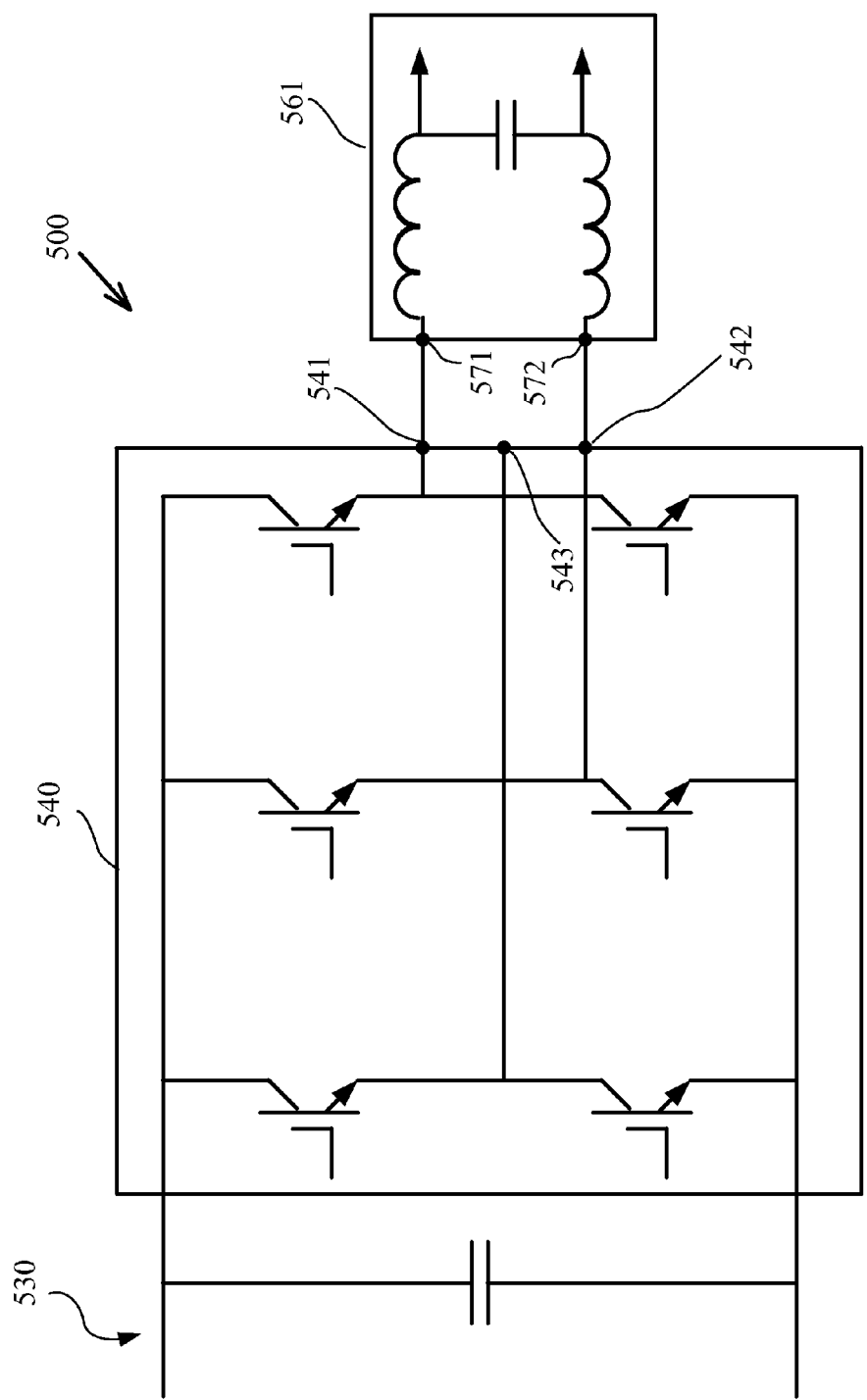
FIG. 5 is a circuit diagram of an exemplary inverter module configuration.
Figure 6:
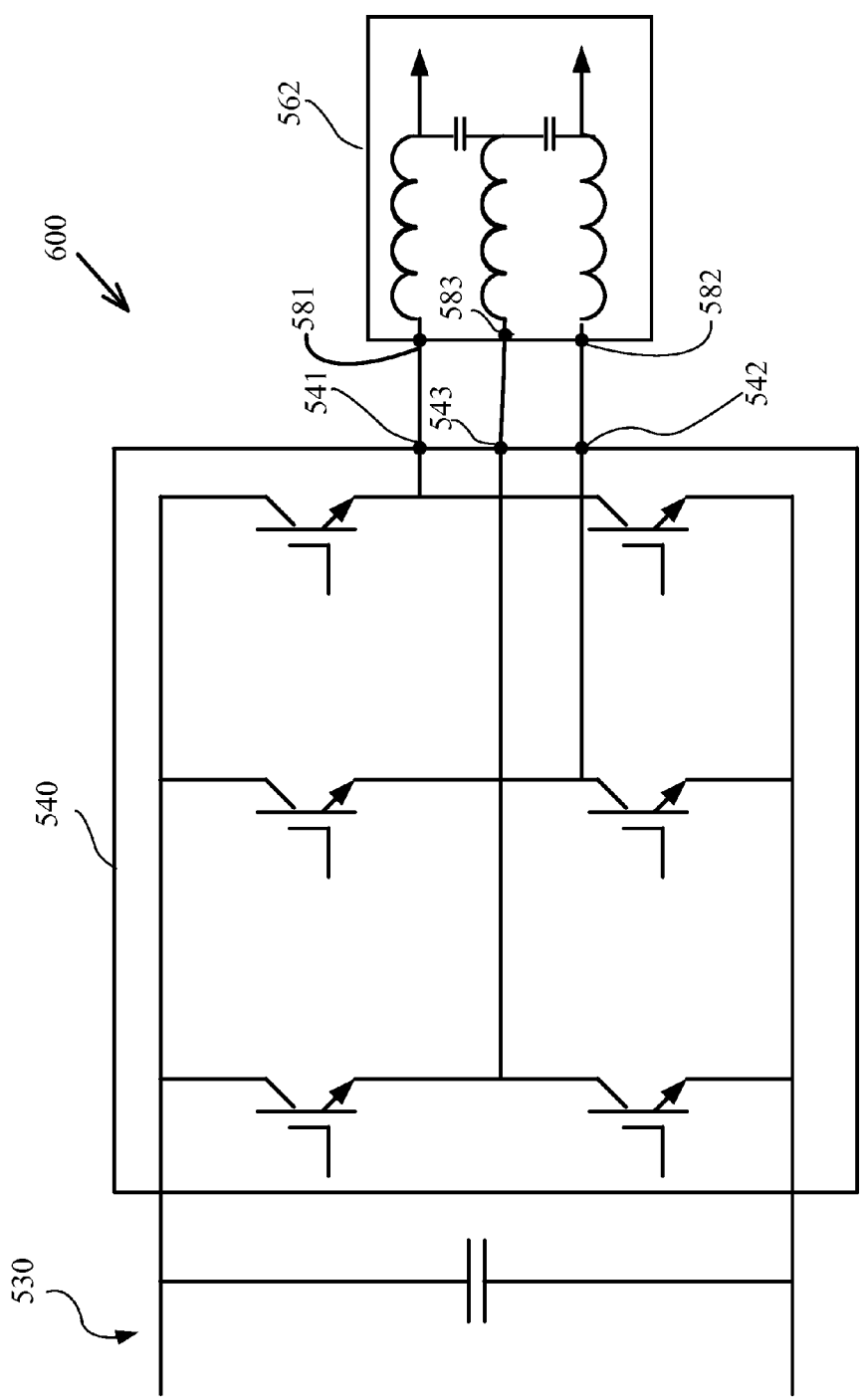
FIG. 6 is a circuit diagram of another exemplary inverter module configuration.
Figure 7:
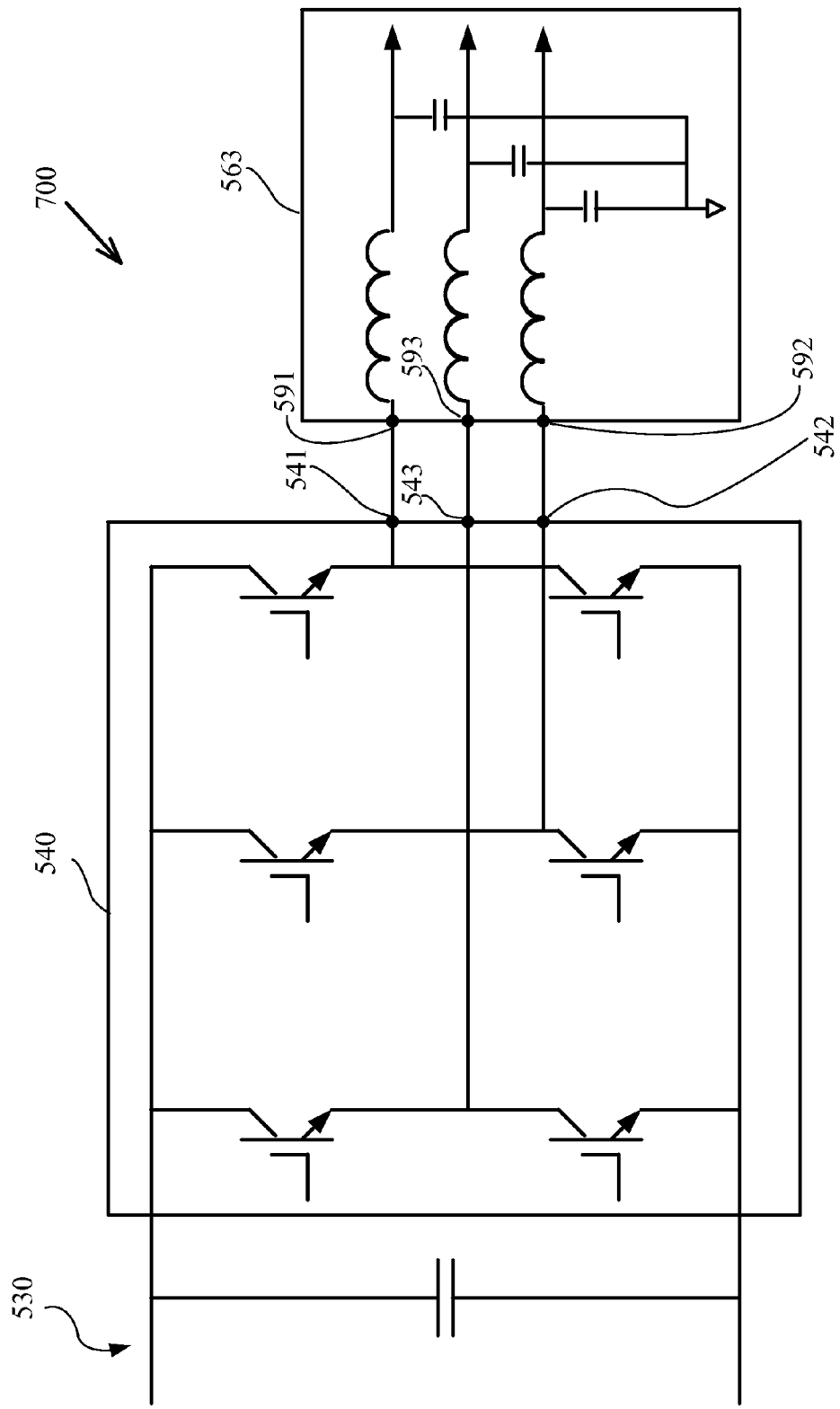
FIG. 7 is a circuit diagram of a further exemplary inverter module configuration.

FIGS. 5-7 illustrate an example of electrical configurability of the inverter output utilizing a single inverter module (showing differing configurations of IGBT bridge 140 and filter 150) with different electrical interconnections. FIG. 5 illustrates a first inverter configuration 500 providing a single phase output in which inverter module 540 is coupled with DC bus 530. A first output 541 from a first leg of inverter module 540 is electrically coupled with a first input 571 of filter module 561. The second output 542 from a second leg of inverter module 540 is electrically coupled with a second input 572 of filter module 561. A third output 543 from the third leg of inverter module 540 is left unconnected.

It is further contemplated that the third leg/third inverter output 543 may be utilized as a hot spare in several different embodiments. In one such embodiment a controller is configured to identify a failure condition in which one of the active legs of inverter 540 fails for example due to a failed transistor. This failure is detectable or generates diagnostic code which may be interpreted by a controller or a technician. The connection to the output of the failed leg can then be changed to the output 543 in the field, for example by reconfiguring the electrical connections between the outputs of inverter module 540 and the inputs of filter module 561. In additional embodiments a controllable switch or relay may be provided to selectively couple outputs 541, 542, and 543 with either of inputs 571 or 572. In either embodiment the converter controller is reconfigured or reprogrammed to provide control signals to the substitute inverter leg. Configuration 500 provides a single phase output which is coupled to single phase output filter 561.

In additional embodiments, a self-heal functionality may be provided in the inverter 500 which diagnoses or detects failed transistor and then either implements an automatic relay re-configuration or indicates a jumper/switch change to allow field service by technician, being able to detect which component failed in the field to reduce false failure diagnosis of the filter, inverter, engine control by either self diagnosis or technician field diagnosis.

In further embodiments the inverter may be field down-configured from 3 or 2 phase output down to single phase if a bridge leg fails or its corresponding gate drive fails. This allows for embodiments of the present invention to have a 120 v or 240 v or other voltage single phase "limp home" mode allowing partial functionality when a 3 phase or 2 phase genset or inverter loses an inverter bridge leg. These embodiments may be advantageously utilized in connection with implementations requiring high reliability.

FIG. 6 illustrates a second inverter configuration 600 in which inverter module 540 is electrically coupled with an output filter 562. In the illustrated configuration inverter 540 is configured to provide a split phase output in which the first phase is defined between output 541 and 543, a second phase is provided between output 542 and 543, and a third phase is provided between output 541 and 542. Configuration 600 may be utilized, for example, in connection with a typical 120 V/240 V home power supply.

With reference to FIG. 7 there is illustrated a third inverter configuration 700 in which inverter module 540 is configured to provide the 3-phase output to filter module 563. Each of outputs 541, 542, and 543 provides a separate phase output relative to a reference. It shall be appreciated that each of configurations 500, 600, and 700 may be implemented utilizing the PCB 200 described above in connection with FIG. 2 and utilizing the same inverter module 540. It is also noted that in other embodiments, filter modules 561, 562, and 563 of configurations 500, 600, and 700 may each be implemented on a separate filter module board. It is further contemplated that various filter modules may be configurable into specific filter module implementations, such as filter modules 561, 562, and 563 illustrated in configurations 500, 600, and 700, via relays, electrical connectors, buss bars, conductive standoffs, jumpers, or wires or by selective population of filter elements.

It shall be appreciated that inverter configurations 500, 600, and 700 may be implemented by providing different filter modules such as filter modules 561, 562 and 563, providing different electrical interconnection between the outputs of inverter module 540 and the inputs of a filter module, and configuring software of control module controlling inverter module 540 to provide a desired type of output. The filter module and the electrical interconnection between the outputs of inverter module 540 and the inputs of the filter module may be selected at the time of manufacture or at the time of installation, and may also be reconfigured in the field after manufacturing or installation. The inverter control module may be programmed to selectably provide a plurality of different output operation modes. Selection between the different output operation modes may be controlled by the use of hard switch or soft switch inputs to select a particular programming mode, or by a field diagnostic and configuration tool. This allows substantially the same inverter controller software to be utilized to implement a plurality of different output configurations. The inverter control module may be also be reprogrammed to implement different output configurations.

Figure 8:
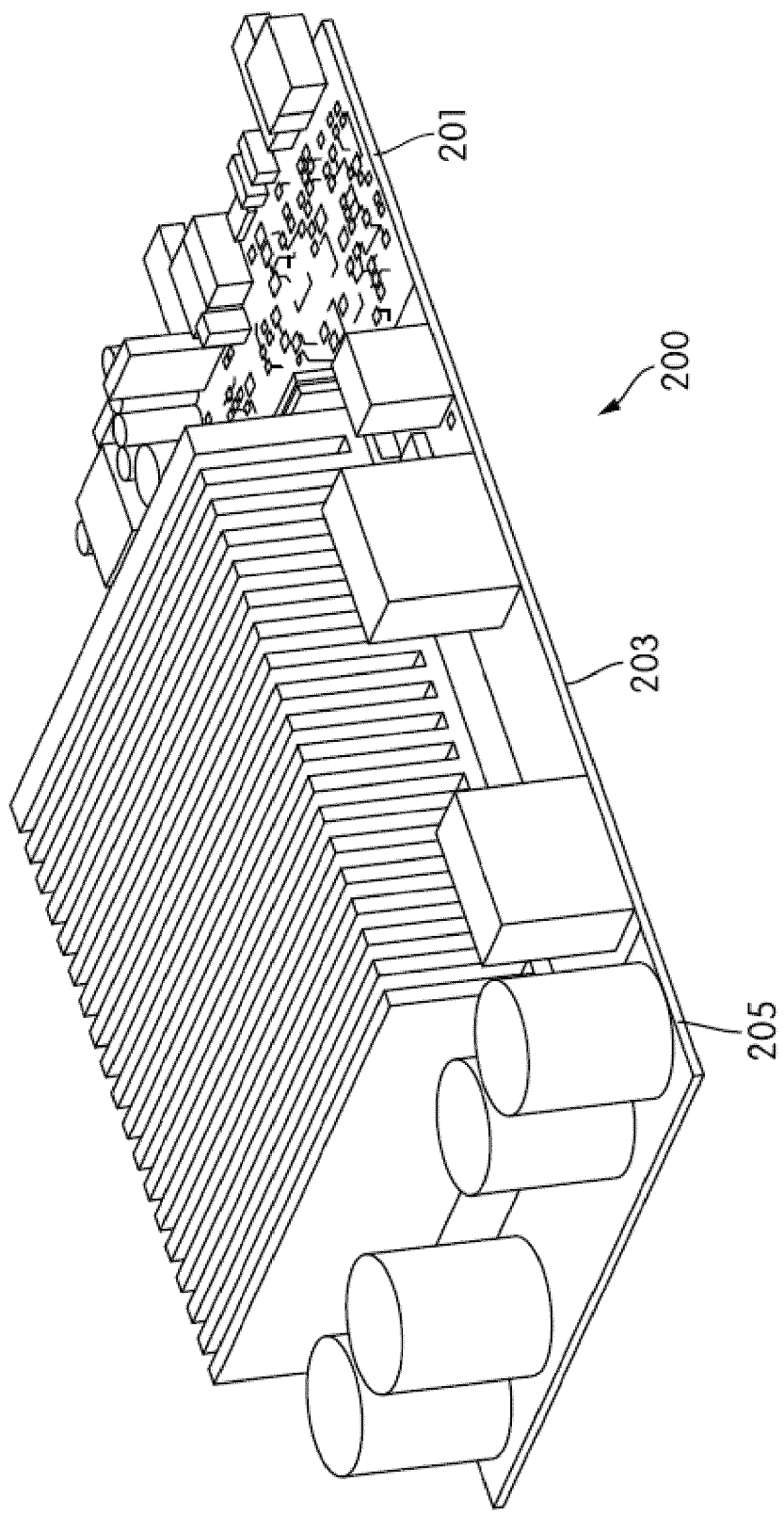
FIG. 8 is a perspective view of an exemplary inverter module in a first packaging configuration.

FIGS. 8-13 illustrate different electrical and physical configurations which may be realized utilizing printed circuit board 200. FIG. 8 illustrates a first physical configuration of PCB 200 in which board segments 201, 203, and 205 remain connected to one another in a single flat configuration and board segment 207 has been removed. Board segment 201 has been populated with an inverter controller. Board segment 203 has been populated with an inverter driver and inverter bridge, heat sink, voltage and current sensors, a rectifier bridge, and electrical interconnections. The inverter bridge, voltage and current sensors, rectifier bridge, electrical interconnections, and programming state of the inverter controller are configured to provide an inverter with a 3 kW single phase output. Board segment 205 has been populated according to a first configuration of capacitors configured for an inverter with a 3 kW or 4 kW single phase output. The electrical interconnections between components of board segments 201, 203, and 205 are substantially as described above in connection with FIG. 2.

It shall be appreciated that the electrical components, electrical interconnections and programming of the inverter controller may be varied to provide different output powers or to provide split phase or three phase outputs using the same configuration of PCB 200 illustrated in FIG. 8.

Figure 9:
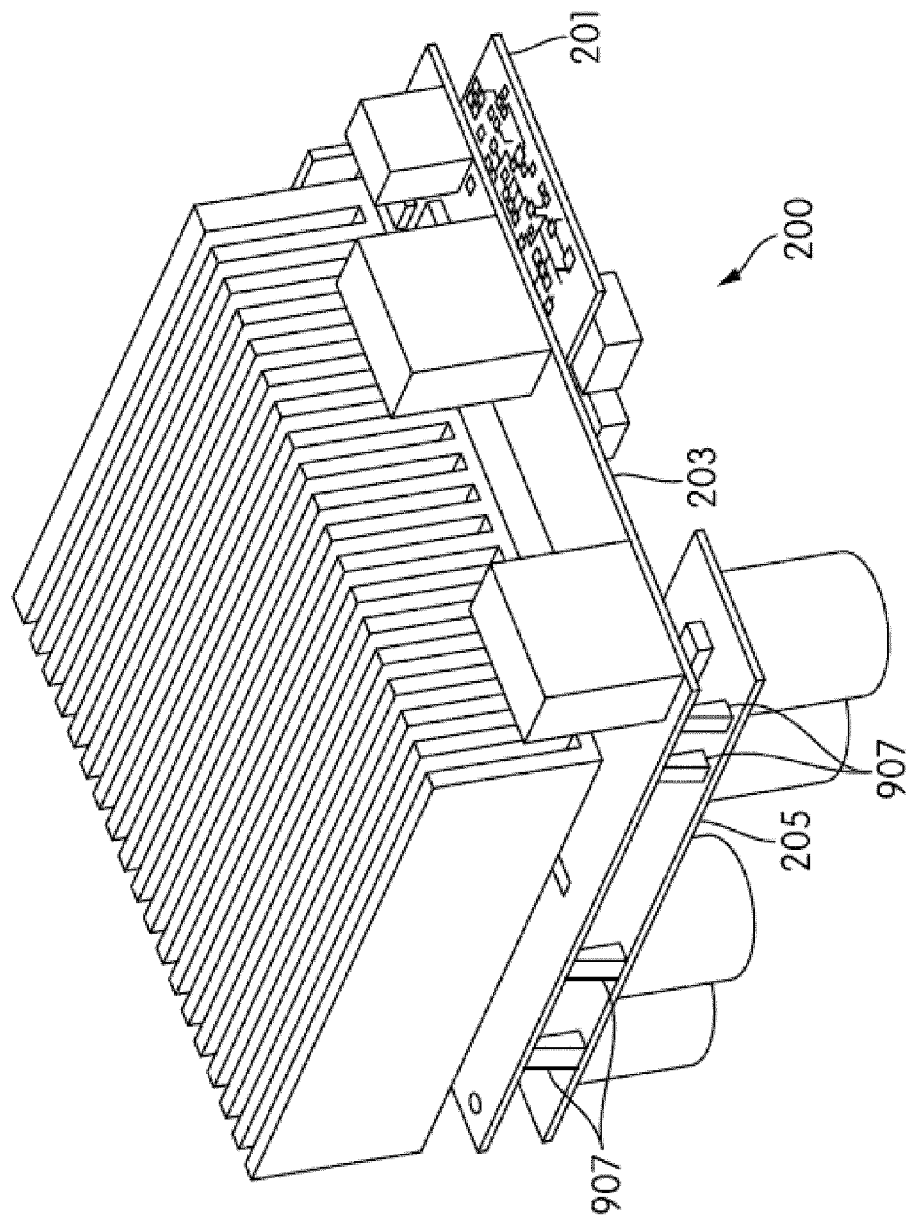
FIG. 9 is a perspective view of the exemplary inverter module of FIG. 8 in a second packaging configuration.

FIG. 9 illustrates a second physical configuration of PCB 200 where board segments 201, 203 and 205 have been separated, and board segments 201 and 205 have been repositioned to extend downward and away from board segment 203. The inverter bridge, heat sink, voltage and current sensors, rectifier bridge, programming state of the inverter controller, and capacitors are configured in the same manner described above in connection with FIG. 8. The electrical interconnections between components of board segments 201 and 203 are provided by a flexible ribbon which accommodates the illustrated repositioning. The electrical interconnections between components of board segments 201 and 203 are provided by buss bars 907 which include a bore permitting interconnection with board segments 201 and 203 by threaded fasteners. It shall be appreciated that the electrical components, electrical interconnections and programming of the inverter controller may be varied to provide different output powers or to provide split phase or three phase outputs using the same configuration of PCB 200 illustrated in FIG. 9. It shall further be appreciated that alternate physical configurations may be provided. In one example, only board segment 201 or 205 is separated from and repositioned relative to board segment 203. In other examples one or both of segments 201 and 205 are positioned at different angles relative to board section 203. It is noted that extended wire and ribbon connectors may be utilized to allow remote mounting of the various board segments. It is also noted that the differing board segments 201, 203, 205, and 207 can allow for a selection of differing component population of the board segments to be made during manufacture and the final inverter configuration (and associated board segments required) only selected and configured at final assembly allowing commonality in parts and manufacturing economies of scale.

Figure 10:
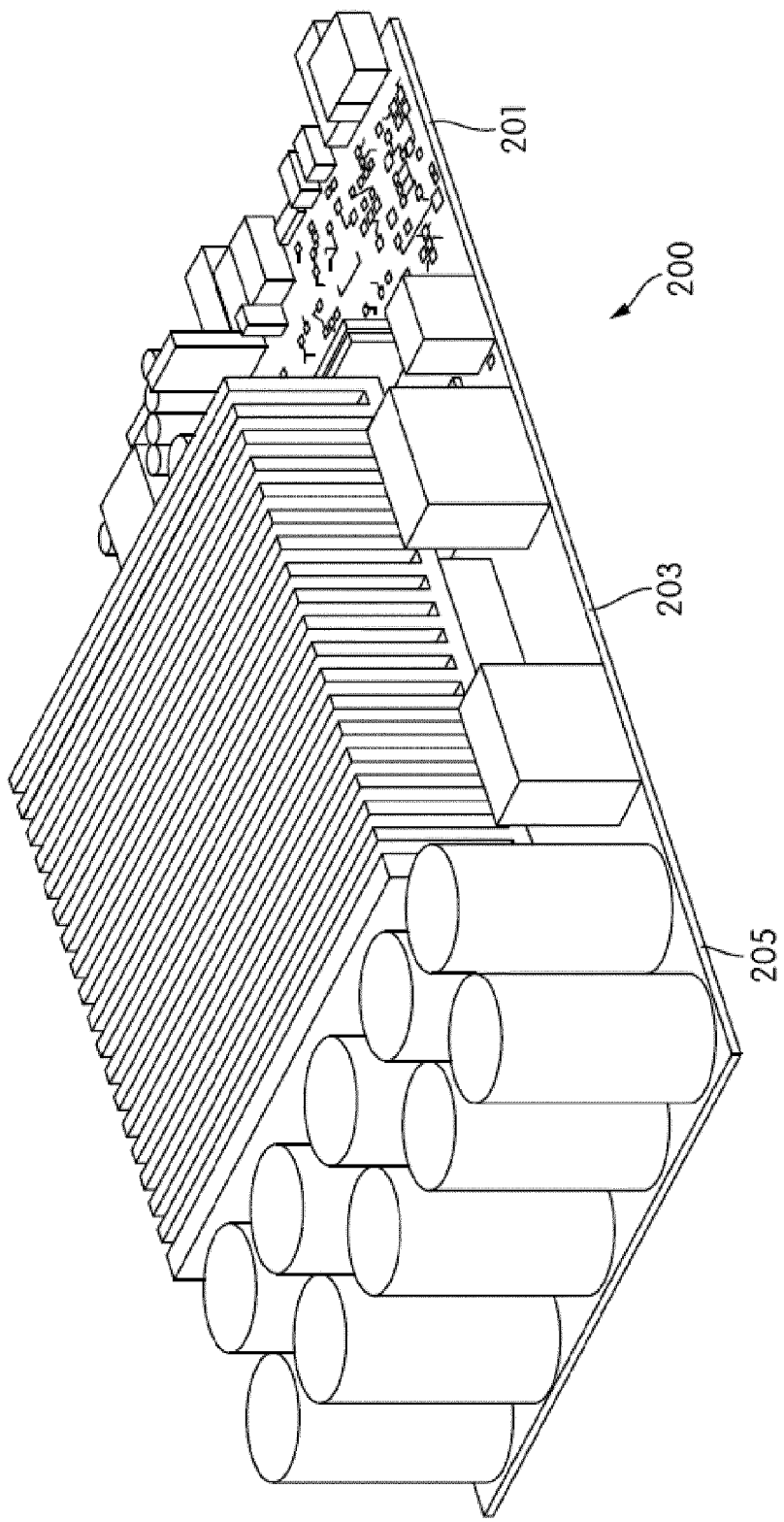
FIG. 10 is a perspective view of another exemplary inverter module in the first packaging configuration.

FIG. 10 illustrates a flat configuration in which PCB 200 has been populated with different components. In the illustrated embodiment board segment 201 has been populated with the same inverter controller as utilized in the embodiments of FIG. 8, but the inverter programming has been configured to provide an 8 kW split phase output. Board segment 203 has been populated with an inverter module, a heat sink, a rectifier module, voltage and current sensor modules compatible with an 8 kW split phase output. Board segment 205 has been populated with capacitor elements compatible with an 8 kW high voltage DC Bus. The electrical interconnections between components of board segments 201, 203, and 205 are substantially as described above in connection with FIG. 2. It shall be appreciated that the electrical components, electrical interconnections and programming of the inverter controller may be varied to provide different output powers or to provide split phase or three phase outputs using the same configuration of PCB 200 illustrated in FIG. 10.

Figure 11:
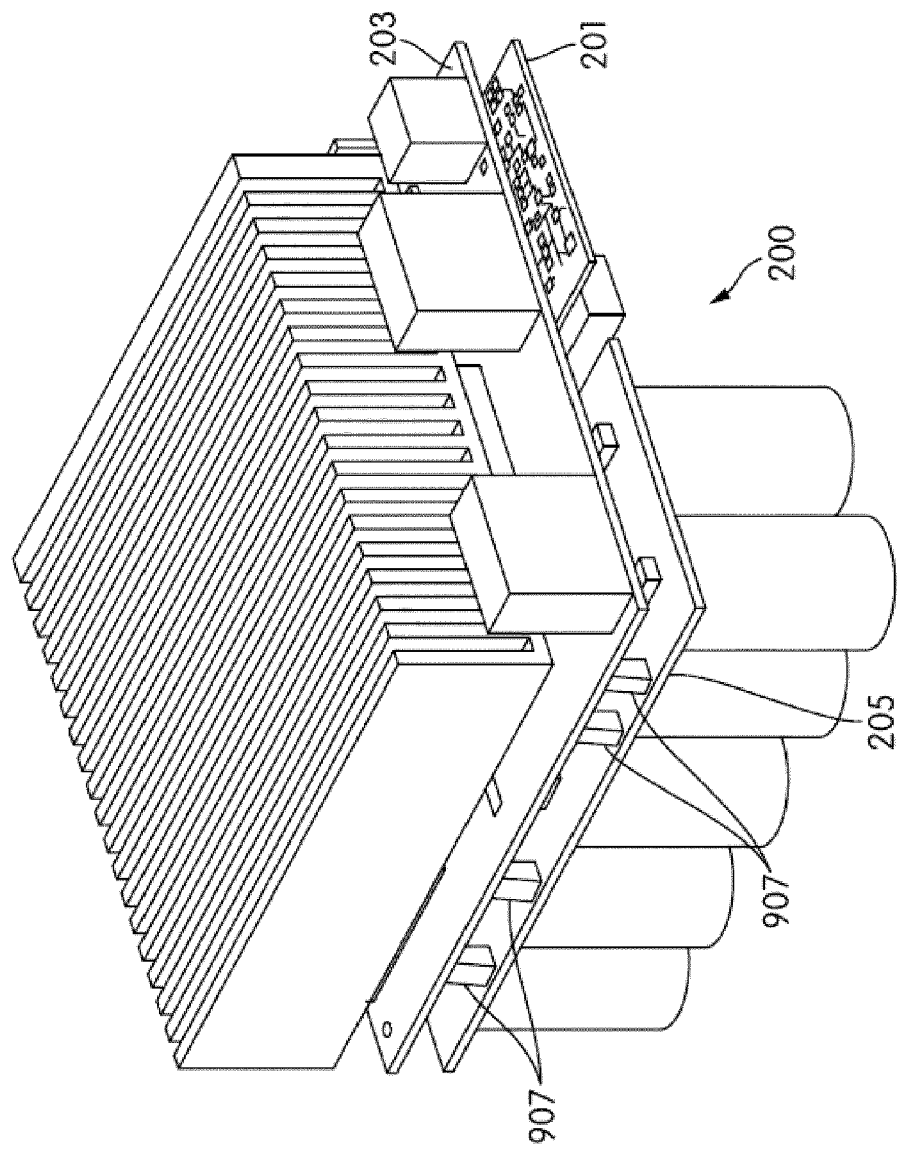
FIG. 11 is a perspective view of the exemplary inverter module of FIG. 10 in the second packaging configuration.

FIG. 11 illustrates a second physical configuration of PCB 200 where board segments 201, 203 and 205 have been separated, and board segments 201 and 205 have been repositioned to extend downward and away from board segment 203. The inverter bridge, voltage and current sensors, rectifier bridge, programming state of the inverter controller, and capacitors are configured in the same manner described above in connection with FIG. 10. The electrical interconnections between components of board segments 201 and 203 are provided by a flexible ribbon which accommodates the illustrated repositioning. The electrical interconnections between components of board segments 201 and 203 are provided by buss bars 907 which include a bore permitting interconnection with board segments 201 and 203 by threaded fasteners. It shall be appreciated that the electrical components, electrical interconnections and programming of the inverter controller may be varied to provide different output powers or to provide split phase or three phase outputs using the same configuration of PCB 200 illustrated in FIG. 11. It shall further be appreciated that alternate physical configurations may be provided. In one example, only board segment 201 or 205 is separated from and repositioned relative to board segment 203. In other examples one or both of segments 201 and 205 are positioned at different angles relative to board section 203, or placed at a distance via wire connections.

Figure 12:
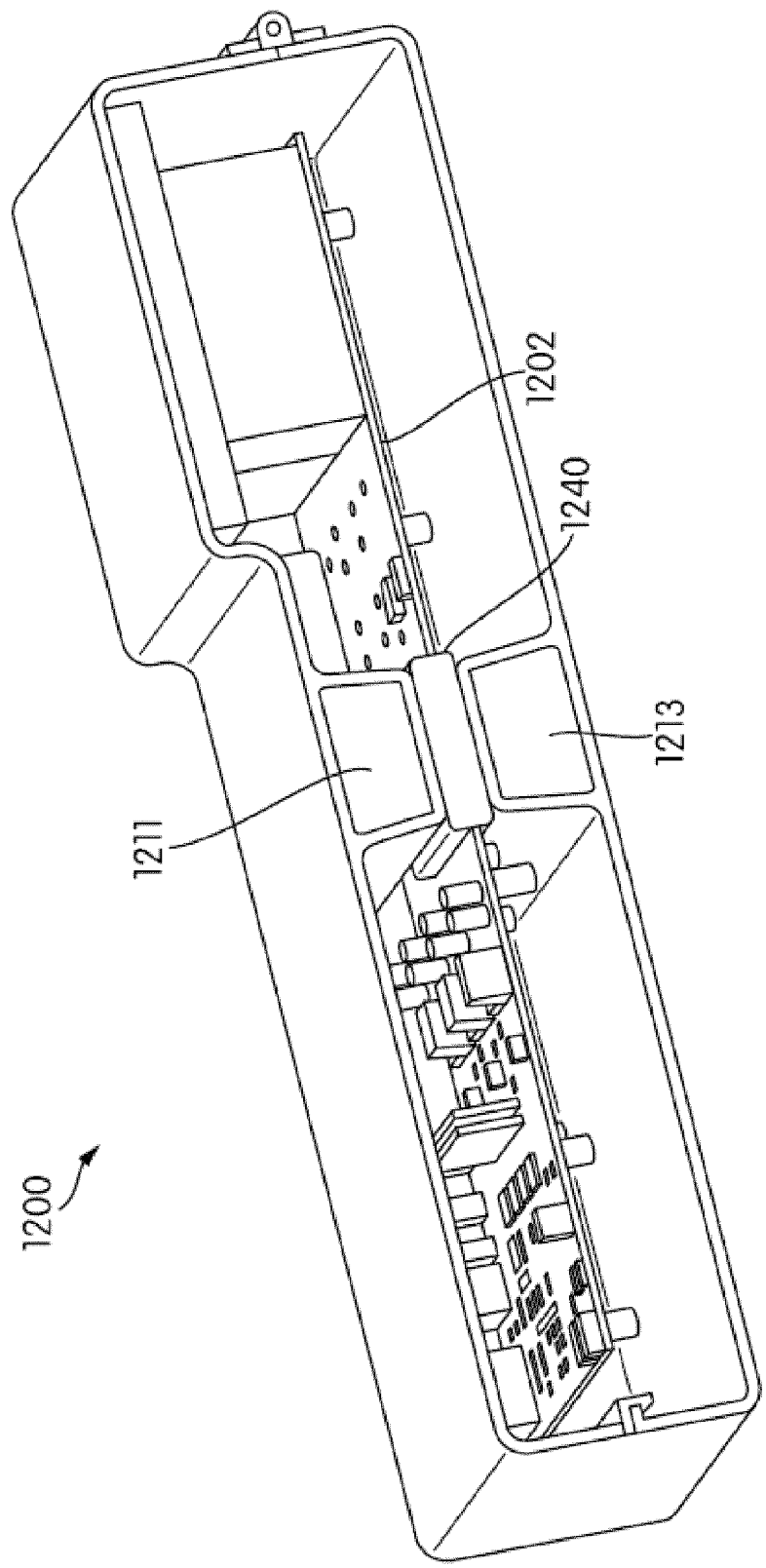
FIG. 12 is a side view of a further exemplary inverter module in a two-sided cooling configuration.

FIG. 12 illustrates an exemplary inverter configuration 1200 providing two sided inverter bridge cooling. A portion of PCB 1202 has been removed, for example, by separation along one or more separation features such as those described above in connection with FIG. 2. An inverter bridge module 1240 has been positioned in the receptacle provided in PCB 1202. Heat sinks 1211 and 1213 can be utilized to allow cooling to occur from both sides of the PCB 1202. Heat sinks 1211 and 1213 may be air cooled heat sinks or may utilize liquid cooling. In an alternate embodiment, the IGBT bridge is elevated off the PCB and a copper, aluminum, heat pipe or other heat conductive element placed below the IGBT bridge and coupled to the air or liquid cooled heat sink of the main IGBT bridge cooling element to allow for double sided cooling with a single sided footprint.

In some embodiments, the PCB may include a plurality of board sections segmented by perforations therebetween. The plurality of board sections are separable at the perforations. The at least two modules are each placed on one of the plurality of board sections. In the first physical configuration, a first board section of the plurality of board sections is integrated with a second board section of the plurality of board sections. In the second physical configuration, the first board section is separated from the second board section and repositioned to a back side of the second board section. The at least two modules may include a filter module. The two or more electrical configurations include a first electrical configuration in which the filter module has a single-phase output, a second electrical configuration in which the filter module has a split-phase output, and a third electrical configuration in which the filter module has a three phase output. The filter module is switched between the first, the second, and the third configurations by software, jumpers, inductors, capacitors, or transformers.

In some embodiments, said dividing the PCB further comprises perforating the PCB into a plurality of separable board sections. The at least two modules are each placed on one of the plurality of board sections. In the first physical configuration, a first board section of the plurality of board sections is integrated with a second board section of the plurality of board sections. In the second physical configuration, the first board section is separated from the second board section and repositioned to a back side of the second board section. In some embodiments, the two or more electrical configurations include a first electrical configuration in which the filter module has a single-phase output, a second electrical configuration in which the filter module has a split-phase output, and a third electrical configuration in which the filter module has a three phase output.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. For example, elements shown as integrally formed may be constructed of multiple parts or elements, the position of elements may be reversed or otherwise varied, and the nature or number of discrete elements or positions may be altered or varied. The order or sequence of any process or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A modular inverter apparatus, comprising:
 a printed circuit board (PCB) comprising at least two modules and one or more mounting components structured to switch the at least two modules between a plurality of physical configurations, wherein, in a first physical configuration, the one or more mounting components couple a second module of the at least two modules to a first module of the at least two modules in a first position, and wherein, in a second physical configuration, the one or more mounting components couple the second module to the first module in a second position different from the first position; and a plurality of electrical interconnections structured to electrically connect the at least two modules by providing a connection between a first plurality of contacts of the first module and a second plurality of contacts of the second module, wherein the plurality of electrical interconnections are structured to switch the at least two modules between a plurality of electrical configurations in the first physical configuration and to switch the at least two modules between the plurality of electrical configurations in the second physical configuration, and wherein the first plurality of contacts of the first module and the second plurality of contacts of the second module are connected in different ways in the plurality of electrical configurations.

2. The modular inverter apparatus of claim 1, wherein the PCB includes a plurality of board sections segmented by perforations therebetween, wherein the plurality of board sections are separable at the perforations, wherein the at least two modules are each placed on one of the plurality of board sections, wherein a first board section of the plurality of board sections is integrated with a second board section of the plurality of board sections in the first physical configuration, and wherein the first board section is separated from the second board section and repositioned to a back side of the second board section in the second physical configuration.

3. The modular inverter apparatus of claim 2, wherein a third board section of the plurality of board sections is removable, and wherein the plurality of electrical interconnections are structured to provide a connection between the first plurality of contacts of the first module to the second plurality of contacts of the second module in response to the third board section being removed.

4. The modular inverter apparatus of claim 2, wherein the plurality of board sections are populated by components based on one of the plurality of physical configurations.

5. The modular inverter apparatus of claim 1, wherein the modular inverter apparatus is structured to receive power from an alternator of a variable speed genset.

6. The modular inverter apparatus of claim 5, wherein at least one of the at least two modules includes a rectifier module, and wherein the modular inverter apparatus is structured to receive the power at the rectifier module.

7. The modular inverter apparatus of claim 1, wherein at least one of the at least two modules includes an inverter bridge module, and wherein the modular inverter apparatus is structured to receive a direct current (DC) power at the inverter bridge module.

8. The modular inverter apparatus of claim 1, wherein at least one of the at least two modules includes a DC bus module, wherein the DC bus module includes a plurality of capacitors placed on a side of the PCB, and wherein the plurality of electrical configurations include a first electrical configuration in which the plurality of capacitors are connected in parallel and a second electrical configuration in which the plurality of capacitors are connected in series.

9. The modular inverter apparatus of claim 1, wherein the modular inverter apparatus is cooled by air cooling, liquid cooling, or active cooling.

10. The modular inverter apparatus of claim 1, wherein at least one of the at least two modules includes an inverter bridge module, wherein at least one of the at least two modules includes an inverter driver module, and wherein an automatic re-configuration is implemented on the module inverter apparatus in response to a failure of a transistor of the inverter bridge module or a gate driver of the inverter driver module.

11. The modular inverter apparatus of claim 10, wherein the plurality of electrical configurations includes a third electrical configuration in which the modular inverter apparatus has a single-phase output and a fourth electrical configuration in which the modular inverter apparatus has a two-phase output, and wherein the automatic reconfiguration includes changing the modular inverter apparatus from the fourth electrical configuration to the third electrical configuration in response to the failure of a transistor of the inverter bridge or a gate driver of the inverter drive module.

12. The module inverter apparatus of claim 10, wherein the plurality of electrical configurations include a third electrical configuration in which the modular inverter apparatus has a single-phase output and a fifth electrical configuration in which the modular inverter apparatus has a three-phase output, and wherein the automatic reconfiguration includes changing the modular inverter from the fifth electrical configuration to the third electrical configuration in response to the failure of a transistor of the inverter bridge or a gate driver of the inverter drive module.

13. The modular inverter apparatus of claim 1, wherein at least one of the at least two modules includes a filter module, wherein the plurality of electrical configurations include a sixth electrical configuration in which the filter module has a single-phase output, a seventh electrical configuration in which the filter module has a split-phase output, and an eighth electrical configuration in which the filter module has a three phase output, and wherein the filter module is switched between the sixth, the seventh, and the eighth electrical configurations by software, jumpers, inductors, capacitors, or transformers.

14. The modular inverter apparatus of claim 1, wherein the modular inverter apparatus includes a wide band-gap device bridge, a silicon carbide device bridge, a gallium nitride device bridge, or a multi-level transistor bridge.

15. The modular inverter apparatus of claim 1, wherein the modular inverter apparatus is configured to output a first voltage under a first electrical configuration of the plurality of electrical configurations and output a second voltage different from the first voltage under a second electrical configuration of the plurality of electrical configurations.

16. The modular inverter apparatus of claim 1, wherein the modular inverter apparatus is configured to output a first power under a first electrical configuration of the plurality of electrical configurations and output a second power different from the first power under a second electrical configuration of the plurality of electrical configurations.

17. The modular inverter apparatus of claim 1, wherein the modular inverter apparatus is configured to output single-phase output under a first electrical configuration of the plurality of electrical configurations, a split-phase output under a second electrical configuration of the plurality of electrical configurations, and a three phase output under a third electrical configuration of the plurality of electrical configurations.

18. A method comprising:
dividing a printed circuit board (PCB) of an inverter into at least two modules, wherein the PCB comprises one or more mounting components structured to switch the at least two modules between a plurality of physical configurations, wherein, in a first physical configuration, the one or more mounting components couple a second module of the at least two modules to a first module of the at least two modules in a first position, and wherein, in a second physical configuration, the one or more mounting components couple the second module to the first module in a second position different from the first position; and electrically connecting the at least two modules via a plurality of electrical interconnections structured to provide a connection between a first plurality of contacts of the first module and a second plurality of contacts of the second module, wherein the at least two modules each comprise at least one of a rectifier module, an inverter bridge module, a filter module, an inverter bridge driver module, an inverter controller module, a current sensor module, a voltage sensor module, and a thermal management module, and wherein the plurality of electrical interconnections are structured to switch the at least two modules between a plurality of electrical configurations in the first physical configuration and to switch the at least two modules between the plurality of configurations in the second physical configuration, and wherein the first plurality of contacts of the first module and the second plurality of contacts of the second module are connected in different ways in the plurality of electrical configurations.

19. The method of claim 18, wherein said dividing the PCB further comprises perforating the PCB into a plurality of separable board sections, wherein the at least two modules are each placed on one of the plurality of board sections, wherein a first board section of the plurality of board sections is integrated with a second board section of the plurality of board sections in the first physical configuration, and wherein the first board section is separated from the second board section and repositioned to a back side of the second board section in the second physical configuration.

20. The method of claim 19, further comprising:
removing a third board section of the plurality of board sections; and
providing a connection between the first plurality of contacts of the first module to the second plurality of contacts of the second module in response to the third board section being removed.

21. The method of claim 18, further comprising receiving power from an alternator of a variable speed genset at the rectifier module.

22. The method of claim 18, wherein at least one of the at least two modules further includes a direct current (DC) bus module, and the method further comprising receiving a DC power at the DC bus module or at the inverter bridge module.

23. The method of claim 18, wherein the plurality of electrical configurations include a first electrical configuration in which the filter module has a single-phase output, a second electrical configuration in which the filter module has a split-phase output, and a third electrical configuration in which the filter module has a three phase output.

24. A modular inverter apparatus, comprising:
a printed circuit board (PCB) comprising at least two modules and one or more mounting components structured to switch the at least two modules between a plurality of physical configurations, wherein, in a first physical configuration, the one or more mounting components couple a second module of the at least two modules to a first module of the at least two modules in a first position, and wherein, in a second physical configuration, the one or more mounting components couple the second module to the first module in a second position different from the first position; and
one or more jumpers structured to electrically connect the at least two modules by providing a connection between a first plurality of contacts of the first module and a second plurality of contacts of the second module, wherein the one or more jumpers are structured to switch the at least two modules between a plurality of electrical configurations in the first physical configuration and to switch the at least two modules between the plurality of electrical configurations in the second physical configuration, and wherein the first plurality of contacts of the first module and the second plurality of contacts of the second module are connected in different ways in the plurality of electrical configurations.

25. The modular inverter apparatus of claim 24, wherein the PCB includes a plurality of board sections segmented by perforations therebetween, wherein the plurality of board sections are separable at the perforations, wherein the at least two modules are each placed on one of the plurality of board sections, wherein a first board section of the plurality of board sections is integrated with a second board section of the plurality of board sections in the first physical configuration, and wherein the first board section is separated from the second board section and repositioned to a back side of the second board section in the second physical configuration.

26. The modular inverter apparatus of claim 25, wherein a third board section of the plurality of board sections is removable, and wherein the one or more jumpers are structured to provide a connection between the first plurality of contacts of the first module to the second plurality of contacts of the second module in response to the third board section being removed.

27. The modular inverter apparatus of claim 24, wherein at least one of the at least two modules includes a filter module, and wherein the plurality of electrical configurations include a first electrical configuration in which the filter module has a single-phase output, a second electrical configuration in which the filter module has a split-phase output, and a third electrical configuration in which the filter module has a three phase output.

\* \* \* \* \*